(12) United States Patent
Oikawa et al.

(10) Patent No.: US 7,167,393 B2
(45) Date of Patent: Jan. 23, 2007

(54) NONVOLATILE SEMICONDUCTOR MEMORY DEVICE CONTAINING REFERENCE CAPACITOR CIRCUIT

(75) Inventors: Kiyoharu Oikawa, Kawasaki (JP); Yukihiro Nishida, Yokohama (JP); Masaya Kubota, Kawasaki (JP); Junji Morita, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/922,906

(22) Filed: Aug. 23, 2004

(65) Prior Publication Data
US 2005/0088877 A1 Apr. 28, 2005

(30) Foreign Application Priority Data
Aug. 26, 2003 (JP) ............... 2003-301269

(51) Int. Cl.
*G11C 16/00* (2006.01)
(52) U.S. Cl. .................... 365/185.2; 365/210
(58) Field of Classification Search ............. 365/185.2, 365/52, 72, 210
See application file for complete search history.

(56) References Cited

U.S. PATENT DOCUMENTS

| 5,105,385 | A | | 4/1992 | Ohtsuka et al. | ........... 365/185.2 |
| 5,157,626 | A | * | 10/1992 | Watanabe | ................ 365/185.2 |
| 5,841,719 | A | * | 11/1998 | Hirata | ......................... 365/210 |
| 5,898,614 | A | * | 4/1999 | Takeuchi | ................. 365/185.1 |
| 6,396,740 | B1 | * | 5/2002 | Chih et al. | ................ 365/185.2 |
| 6,819,615 | B1 | * | 11/2004 | Fastow et al. | .............. 365/210 |

FOREIGN PATENT DOCUMENTS

| JP | 7-15952 | 2/1995 |
| JP | 9-320283 | 12/1997 |
| JP | 2003-22680 | 1/2003 |

* cited by examiner

*Primary Examiner*—Tan T. Nguyen
(74) *Attorney, Agent, or Firm*—Oblon, Spivak, McClelland, Maier & Neustadt, P.C.

(57) ABSTRACT

A plurality of dummy cells which generate reference potential corresponding to a capacitance of a bit line each have a floating gate, control gate and first and second diffusion layers. The first and second diffusion layers of each dummy cell are commonly connected by use of a wiring.

17 Claims, 14 Drawing Sheets

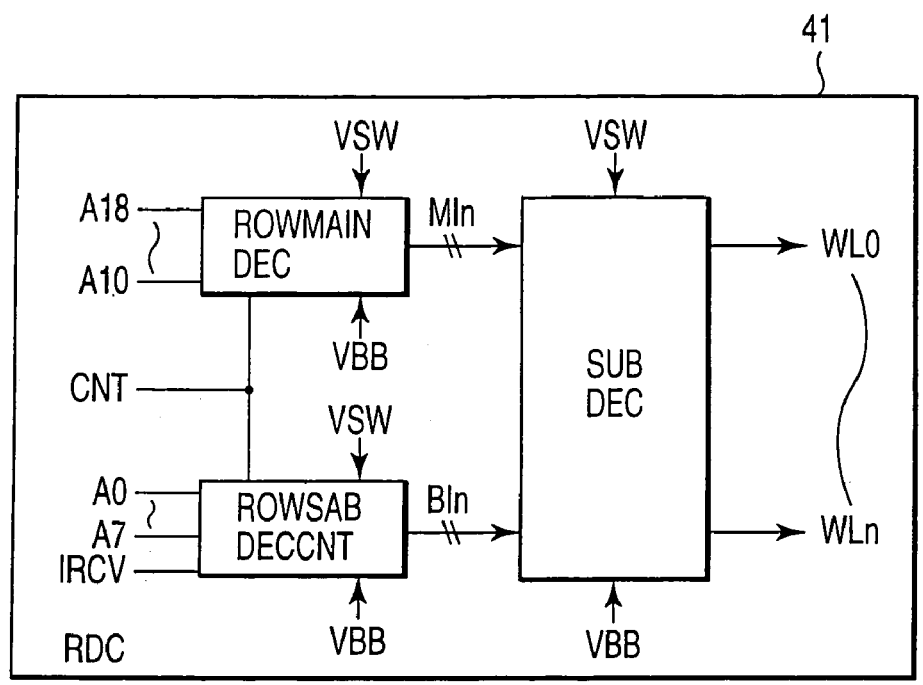
F I G. 7
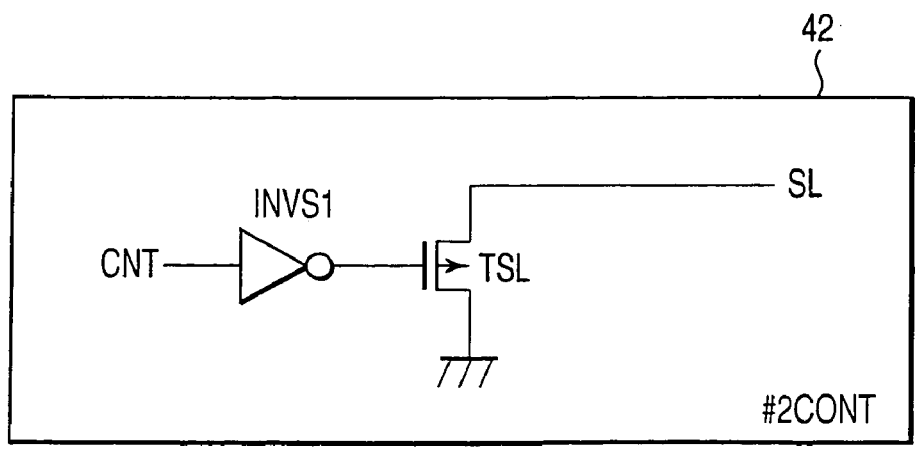
F I G. 8

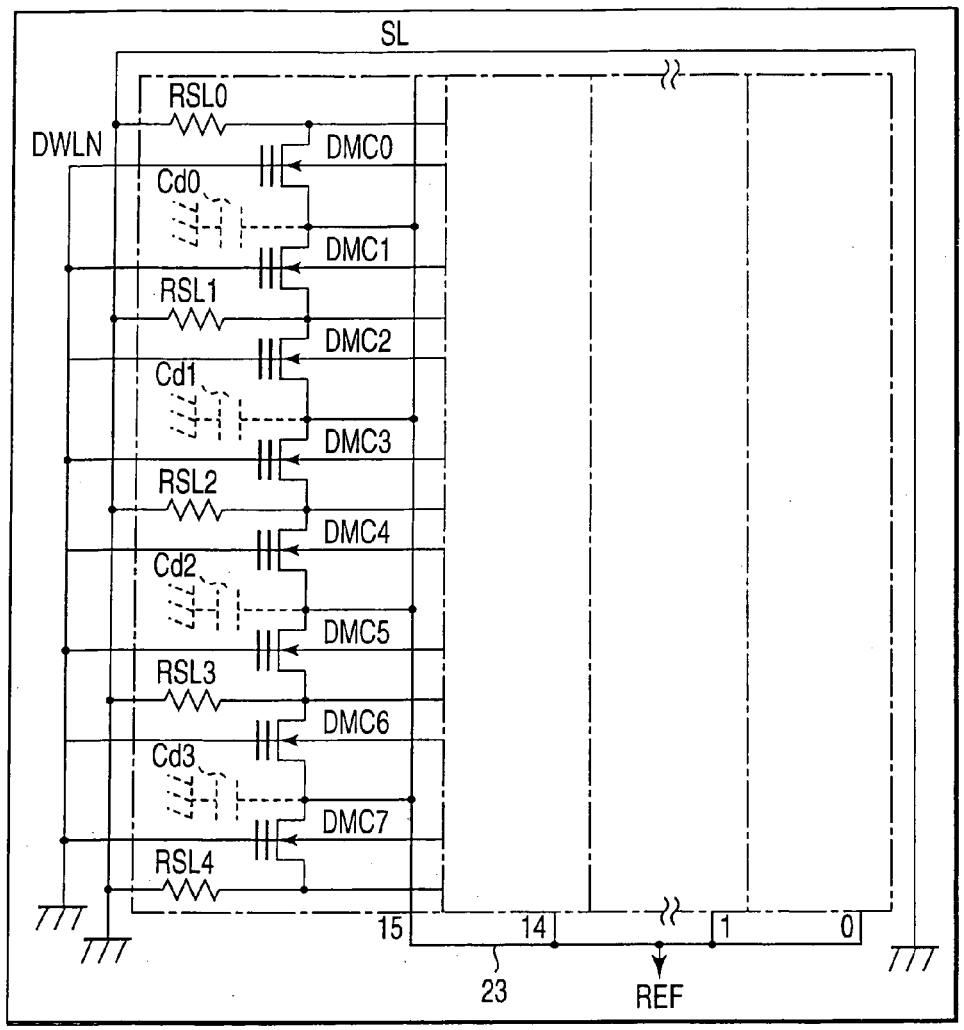
F I G. 1 9 (PRIOR ART)
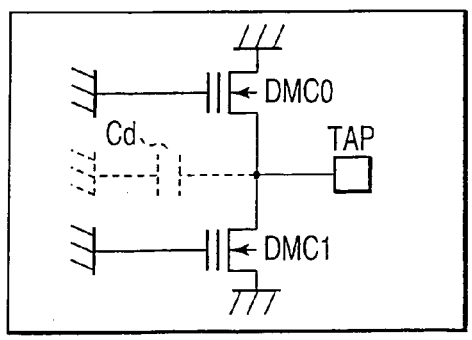
F I G. 2 0 (PRIOR ART)

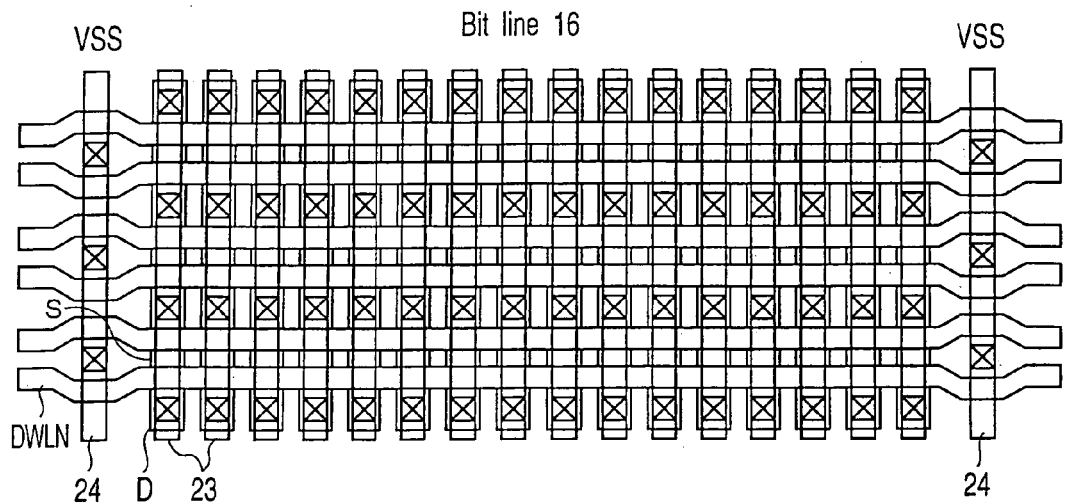
F I G. 2 1   (PRIOR ART)
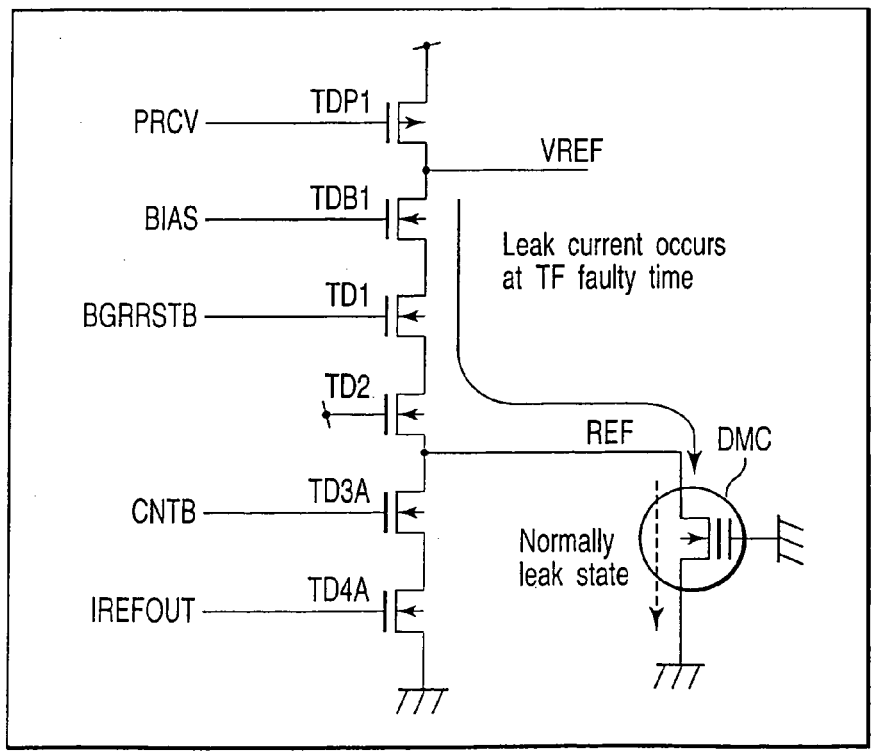
F I G. 2 2   (PRIOR ART)

NONVOLATILE SEMICONDUCTOR MEMORY DEVICE CONTAINING REFERENCE CAPACITOR CIRCUIT

CROSS-REFERENCE TO RELATED APPLICATIONS

This application is based upon and claims the benefit of priority from prior Japanese Patent Application No. 2003-301269, filed Aug. 26, 2003, the entire contents of which are incorporated herein by reference.

BACKGROUND OF THE INVENTION

1. Field of the Invention

This invention relates to a nonvolatile semiconductor memory device containing a reference capacitor circuit and applied to a microcomputer system having a memory mounted thereon, for example.

2. Description of the Related Art

FIG. 18 shows one example of a floor plan of the conventional nonvolatile semiconductor memory device, for example, a precharge type NOR flash EEPROM. A nonvolatile semiconductor memory device 11 includes memory cell arrays (MCA) 12, 13 each having a plurality of memory cells arranged in a matrix form. Row decoders (RDC) 14, 15 which select word lines (not shown), first regions 16, 17, second region 18, second control circuits (#2CONT) 19, 20 and signal wiring regions SGL1, SGL2 are arranged in the neighborhood of the memory cell arrays 12, 13. In the first regions 16, 17, sense amplifiers (S/A) which each detect and amplify data read out from a memory cell and the like are arranged. In the second region 18, a redundant column decoder (RDCDC) which selects a redundant bit line, a column decoder (CDC) which selects a bit line (not shown), a bias generating circuit (LVLGEN) which generates a bias voltage and a first control circuit (#1CONT) which generates various control signals are arranged.

Further, the nonvolatile semiconductor memory device 11 includes reference capacitor circuits 21, 22. When the potential of a bit line is detected by use of the sense amplifier, the reference capacitor circuits 21, 22 supply reference potential to the sense amplifier. The reference capacitor circuits 21, 22 are circuits each having the same capacitance as a parasitic capacitance of bit lines configuring the memory cell array. The parasitic capacitance of the bit lines depends on diffusion junction capacitance of the drain configuring the memory cell rather than wiring capacitance. Therefore, the conventional reference capacitor circuits 21, 22 respectively have the same number of dummy cells as the memory cells of the memory cell arrays 12, 13 and are formed with the same circuit configuration as that of the memory cell arrays 12, 13.

As a related technique, a memory in which a readout potential of a memory cell is compared with a readout potential of a dummy cell and sensed and amplified is developed (for example, refer to Jpn. Pat. Appln. KOKOKU Publication No. H7-15952). Further, memory cells in which data is written in order to deteriorate the dummy cells having the configuration equivalent to that of the memory cells at the same rate as the memory cells are developed (for example, refer to Jpn. Pat. Appln. KOKAI Publication No. 2003-22680). In addition, a semiconductor memory device having reference cells whose gates are connected to discharging transistors is developed (for example, refer to Jpn. Pat. Appln. KOKAI Publication No. H9-320283).

FIG. 19 shows the conventional reference capacitor circuit and FIG. 20 shows a part of the circuit. Further, FIG. 21 shows the layout of the reference capacitor circuit and FIG. 22 shows the equivalent circuit of a portion ranging from the reference capacitor circuit to the sense amplifier. As shown in FIG. 19, the sources (S) of dummy cells DMC0, . . . , DMC7 are connected to a source line SL and the drains (D) of the dummy cells DMC0, . . . , DMC7 are connected together by use of a metal wiring 23, for example. A reference potential is supplied to a connection node REF via the metal wiring 23. Further, the control gate of each dummy cell DMC is grounded via a dummy word line DWLN. Thus, since the conventional reference capacitor circuit has the same configuration as the memory cell array, the number of dummy cells of the reference capacitor circuit increases as the capacity of the memory cell array becomes larger and, as a result, the layout area is inevitably increased.

Further, since the conventional reference capacitor circuit has the same configuration as the memory cell array, it is necessary to provide the source wiring SL connected to the sources of the dummy cells and a VSS wiring 24 which supplies ground potential VSS to the source line in the reference capacitor circuit as shown in FIGS. 19 and 21. Therefore, if the VSS wiring 24 and metal wiring 23 are formed of a first-layered metal wiring, for example, restriction is imposed on the arrangement of the connection node REF which derives a reference potential from the metal wiring 23.

Further, in order to prevent occurrence of a leak, it is necessary to eliminate charges stored in the floating gate of the conventional dummy cell DMC by irradiation of ultraviolet rays, for example. Therefore, a large number of metal wirings cannot be arranged above the dummy cell. Further, in order to prevent an increase in the resistance of the VSS wiring 24, it is necessary to reduce the length of the VSS wiring 24 and arrange the reference capacitor circuit near the sense amplifier. Therefore, restriction is imposed on the arrangement of the reference capacitor circuit.

Further, if the gate oxide film of the dummy cell becomes faulty, the dummy cell is set in a normally leaking state. FIG. 22 shows the leak state of the dummy cell. In order to compare FIG. 22 with FIG. 14 which will be described later, in FIG. 22, common reference symbols are attached to the same portions as those of FIG. 14. As shown in FIG. 22, if a leak occurs, the precharge level of each portion is lowered in the precharge period. Further, in a next sense period, potential of the reference signal REF is rapidly discharged due to the leak of the dummy cell. Therefore, when an ON cell is detected, for example, two P-channel transistors configuring the sense amplifier are turned ON and the discharging operation for the bit line is delayed. In the worst case, the discharge potential of the bit line does not reach the ground potential and will be set at an intermediate level. In this case, in a next data readout period, an erroneous read operation occurs. That is, when data is read out from the ON cell, the data will be originally set at "1", but the data is actually set at "0" (OFF cell). Further, even when data is correctly read out, an operation current in the precharge period will be increased due to occurrence of the leak. Therefore, it is desired to provide a nonvolatile semiconductor memory device in which the occupied area of the reference capacitor circuit can be reduced and occurrence of the leak current can be prevented.

BRIEF SUMMARY OF THE INVENTION

According to a first aspect of the invention, there is provided a nonvolatile semiconductor memory device comprising a dummy cell having first and second diffusion layers, floating gate and control gate, the dummy cell having capacitance corresponding to the additional capacitance of a bit line; and a wiring which commonly connects the first and second diffusion layers of the dummy cell.

According to a second aspect of the invention, there is provided a nonvolatile semiconductor memory device comprising a memory cell having a floating gate, control gate, and drain and source, the drain of the memory cell being connected to a bit line, the source thereof being connected to a source line and the control gate thereof being connected to a word line; a sense amplifier having a first input terminal to which a signal read out from the memory cell to the bit line is supplied and a second input terminal to which a reference signal is supplied; a precharge circuit which precharges the first and second input terminals of the sense amplifier, and a dummy cell having a floating gate, control gate, and first and second diffusion layers, the first and second diffusion layers of the dummy cell being commonly connected and the reference signal being output from a connection node of the first and second diffusion layers.

According to a third aspect of the invention, there is provided a nonvolatile semiconductor memory device comprising a memory cell array having a plurality of memory cells arranged at intersections between a plurality of bit lines and a plurality of word lines; a plurality of sense amplifiers each having a first input terminal which is supplied with a signal read out from a selected one of the memory cells of the memory cell array and a second input terminal which is supplied with a reference signal; and a dummy cell array having a plurality of dummy cells each having a floating gate, control gate, and first and second diffusion layers and arranged in a matrix form, the first and second diffusion layers of each dummy cell of the dummy cell array being commonly connected via a wiring and the dummy cell array outputting the reference signal corresponding to a capacitance of the bit line.

According to a fourth aspect of the invention, there is provided a nonvolatile semiconductor memory device comprising a memory cell array having a plurality of memory cells arranged in rows and columns, each of the memory cells having a floating gate, control gate, drain and source; a sense amplifier region arranged adjacent to the memory cell array, the sense amplifier region having a plurality of sense amplifiers; a column selection region arranged adjacent to the sense amplifier region, the column selection region having a column selection circuit which selects a column of the memory cell array; and a dummy cell array arranged in opposition to the sense amplifier region with the column selection region disposed therebetween, the dummy cell array having a plurality of dummy cells each having a floating gate, control gate, and first and second diffusion layers and the first and second diffusion layers of each dummy cell being connected together.

BRIEF DESCRIPTION OF THE SEVERAL VIEWS OF THE DRAWING

FIG. 7 is a circuit diagram showing an example of a row decoder shown in FIG. 2;

FIG. 8 is a circuit diagram showing an example of a second control circuit shown in FIG. 2;

FIG. 19 is a circuit diagram of the reference conventional capacitor circuit;

FIG. 20 is a circuit diagram showing an extracted main portion shown in FIG. 19;

FIG. 21 is a plan view showing an example of the layout of the conventional reference capacitor circuit; and FIG. 22 is an equivalent circuit diagram of the conventional reference capacitor circuit.

DETAILED DESCRIPTION OF THE INVENTION

There will now be described an embodiment of this invention with reference to the accompanying drawings.

Figure 2:
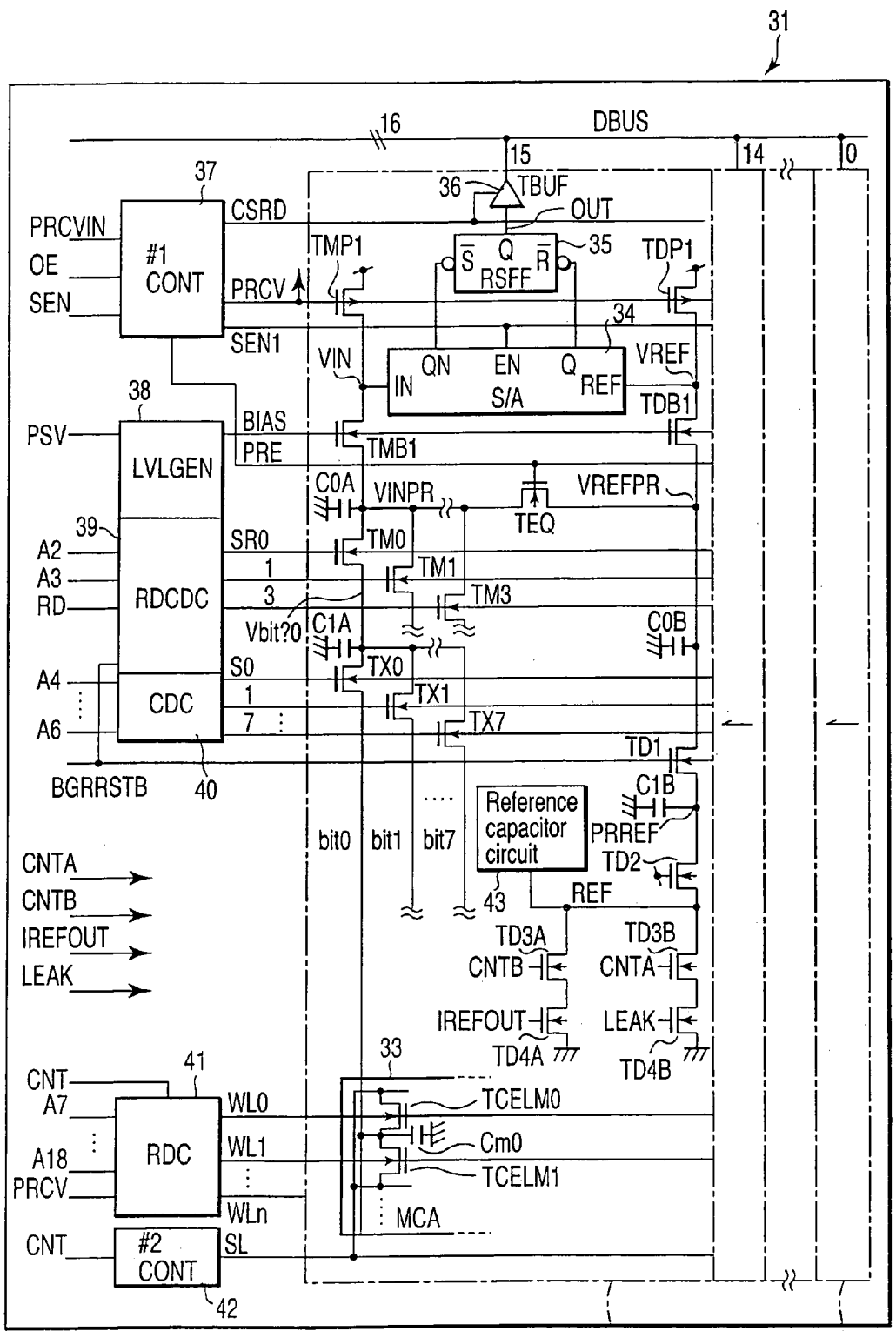
FIG. 2 is a circuit diagram showing an example of a nonvolatile semiconductor memory device to which the embodiment of this invention is applied.

FIG. 2 shows one example of a nonvolatile semiconductor memory device 31, for example, precharge type NOR FLASH-EEPROM to which the embodiment of this invention is applied. In FIG. 2, a write/erase-series circuit is omitted.

In FIG. 2, 16 memory circuits 32-0, . . . , 32-15 are connected to a data bus DBUS. Each of the memory circuits 32-0, . . . , 32-15 includes a memory cell array 33, sense amplifier (S/A) 34, flip-flop circuit 35, buffer circuit 36 and the like. In a portion adjacent to the memory circuit 32-15, a first control circuit (#1CONT) 37, bias generating circuit (LVLGEN) 38, redundant column decoder (RDCDC) 39, column decoder (CDC) 40, row decoder (RDC) 41 and second control circuit (#2CONT) 42 are provided.

The first control circuit 37 generates a signal CSRD, precharge signal PRCV, sense amplifier enable signal SEN1 and equalize signal PRE according to a signal PRCVIN, output enable signal OE and sense signal SEN which indicate a precharge period, sense period and data output period. The bias generating circuit 38 generates a signal BIAS according to a signal PSV. The redundant column decoder 39 generates selection signals SR0, ..., SR3 which select the redundant column according to address signals A2, A3, redundant control signal RD and signal BGRRSTB. The column decoder 40 generates selection signals S0, ..., S7 which select the bit line according to address signals A4, ..., A6. The row decoder 41 selects word lines WL0, ..., WLn according to address signals A7, ..., A18, control signal CNT and precharge signal PRCV supplied from the first control circuit 37. The second control circuit 42 controls a source line SL according to the control signal CNT.

In the memory circuit 32-15, the memory cell array 33 has a plurality of memory cells TCELM0, TCELM1, ... arranged in a matrix form. The drains of the memory cells TCELM0, TCELM1, ... are connected to respective bit lines bit0, bit1, ... and the sources thereof are connected to the source line SL. Further, the gates of the memory cells TCELM0, TCELM1, ... are connected to respective word lines WL0, WL1, ..., WLn. A symbol Cm0 indicates diffusion junction capacitance lying on each of the drains of the memory cells TCELM0, TCELM1, ....

The bit lines bit0, bit1, ... are connected to one ends of the current paths of column selection transistors TX0, ..., TX7 configured by N-channel MOS transistors (which are hereinafter referred to as NMOS transistors). The gates of the transistors TX0, ..., TX7 are supplied with selection signals S0, ..., S7 output from the column decoder 40. The other ends of the current paths of the transistors TX0, ..., TX7 are commonly connected and the connection node is connected to one end of the current path of a redundant column selection transistor TM0 which is configured by an NMOS transistor. The gates of the redundant column selection transistors TM0, ..., TM3 are supplied with selection signals SR0, ..., SR3 output from the redundant column decoder 39. The other ends of the current paths of the redundant column selection transistors TM0, ..., TM3 are commonly connected and the connection node VINPR is connected to the first input terminal IN of the sense amplifier 34 via a bias control transistor TMB1 which is configured by an NMOS transistor. The transistor TMB1 biases the connection node VINPR according to a signal BIAS supplied from the bias generating circuit 38.

A P-channel MOS transistor (which is hereinafter referred to as a PMOS transistor) TMP1 is connected between the first input terminal IN (connection node VIN) of the sense amplifier 34 and the power supply node. The transistor TMP1 precharges the connection node VIN according to the precharge signal PRCV supplied from the first control circuit 37.

A PMOS transistor TDP1 is connected between the second input terminal REF of the sense amplifier 34 and the power supply node. The transistor TDP1 precharges the connection node VREF according to the precharge signal PRCV supplied from the first control circuit 37. An NMOS transistor TDB1 is connected between the second input terminal REF (connection node VREF) of the sense amplifier 34 and a connection node VREFPR. The transistor TDB1 biases the connection node VREFPR according to a signal BIAS supplied from the bias generating circuit 38. Further, an NMOS transistor TEQ is connected between the connection node VREFPR and a connection node VINPR. The transistor TEQ equalizes the connection nodes VREFPR and VINPR to the same potential according to an equalize signal PRE supplied from the first control circuit 37.

An NMOS transistor TD1 is connected between the connection node VREFPR and a connection node PRREF. The transistor TD1 controls the stop state according to a signal BGRRSTB. An NMOS transistor TD2 which is normally set ON is connected between the connection nodes PRREF and REF. The connection node REF is connected to a reference capacitor circuit 43 which will be described later. NMOS transistors TD3A, TD4A are serially connected between the connection node REF and the ground node. Further, NMOS transistors TD3B, TD4B are serially connected between the connection node REF and the ground node. The gates of the transistors TD3A, TD4A are respectively supplied with externally supplied signals CNTB, IREFOUT and the gates of the transistors TD3B, TD4B are respectively supplied with externally supplied signals CNTA, LEAK.

In FIG. 2, for example, the reference capacitor circuit 43 is arranged between the column selection transistors TX0, ..., TX7 and the memory cell array 33. However, the position of the arrangement of the reference capacitor circuit 43 is not limited to this position.

FIGS. 3 to 10 show examples of the various circuits of FIG. 2. The circuits are not essential in this embodiment, and therefore, the concrete explanation thereof is omitted.

Figure 3:
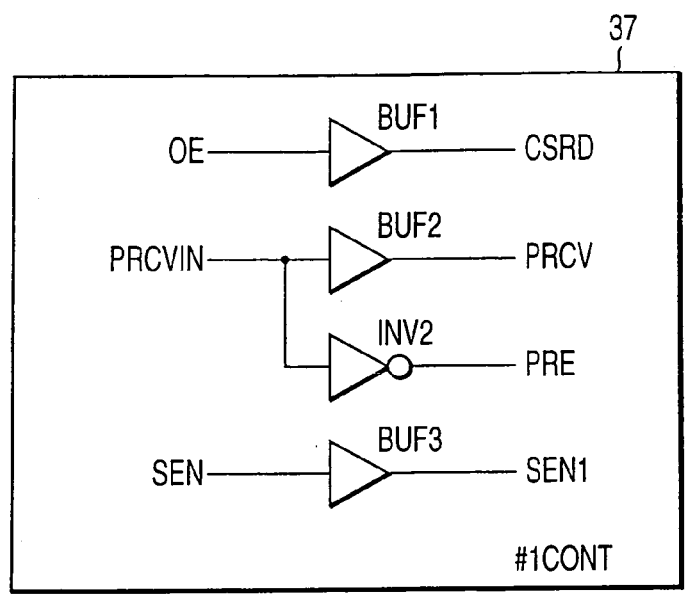
FIG. 3 is a circuit diagram showing an example of a first control circuit shown in FIG. 2.

FIG. 3 shows an example of the first control circuit 37. The first control circuit 37 includes an inverter circuit INV2 and buffer circuits BUF1, BUF2, BUF3.

Figure 4:
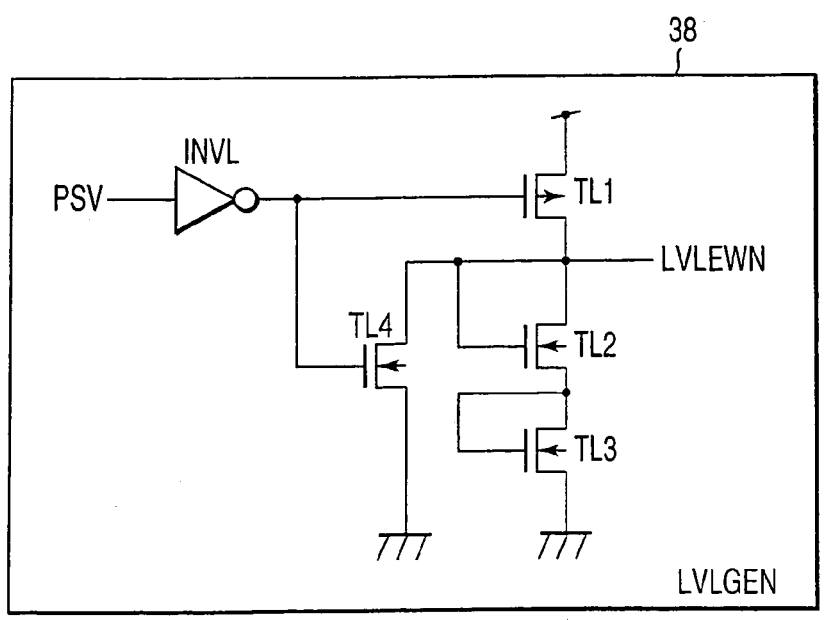
FIG. 4 is a circuit diagram showing an example of a bias generating circuit shown in FIG. 2.

FIG. 4 shows an example of the bias generating circuit 38. The bias generating circuit 38 includes an inverter circuit INVL, PMOS transistor TL1 and NMOS transistors TL2, TL3, TL4.

Figure 5:
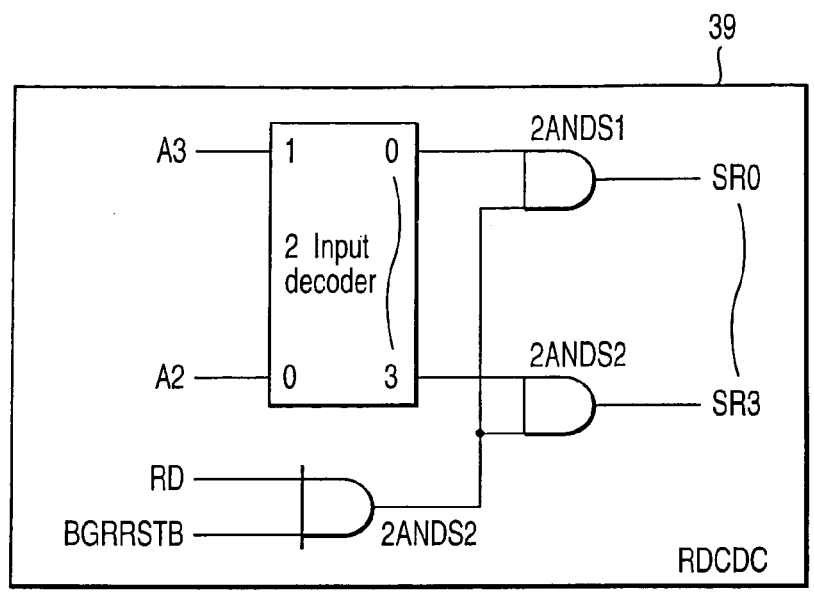
FIG. 5 is a circuit diagram showing an example of a redundant column decoder shown in FIG. 2.

FIG. 5 shows an example of the redundant column decoder 39. The redundant column decoder 39 includes a 2-input decoder and 2-input AND circuits 2ANDS1, 2ANDS2, 2ANDS3.

Figure 6:
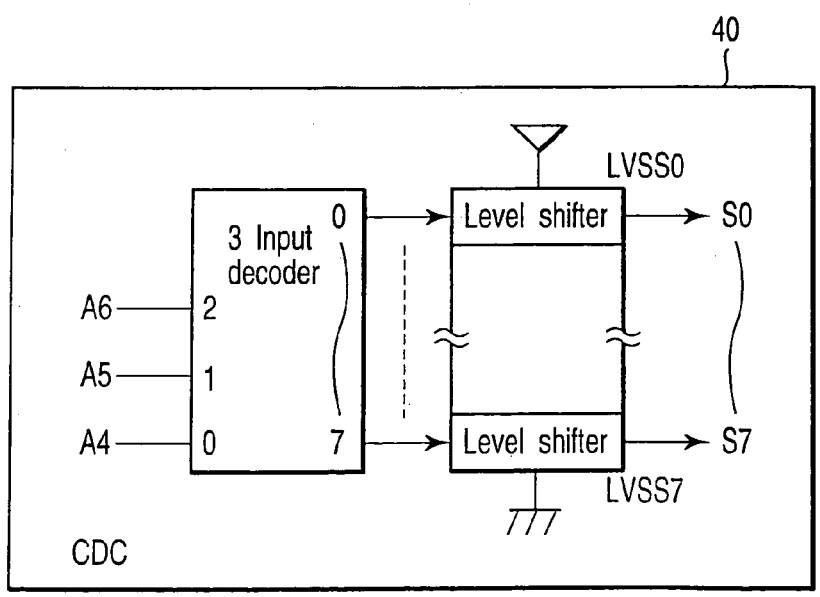
FIG. 6 is a circuit diagram showing an example of a column decoder shown in FIG. 2.

FIG. 6 shows an example of the column decoder 40. The column decoder 40 includes a 3-input decoder and eight level shifters LVSS0, ..., LVSS7.

FIG. 7 shows an example of the row decoder 41. The row decoder 41 includes a row main decoder, row sub decoder and a sub decoder connected to the above decoders.

FIG. 8 shows an example of the second control circuit 42. The second control circuit 42 includes an inverter circuit INVS1 and PMOS transistor TSL.

Figure 9:
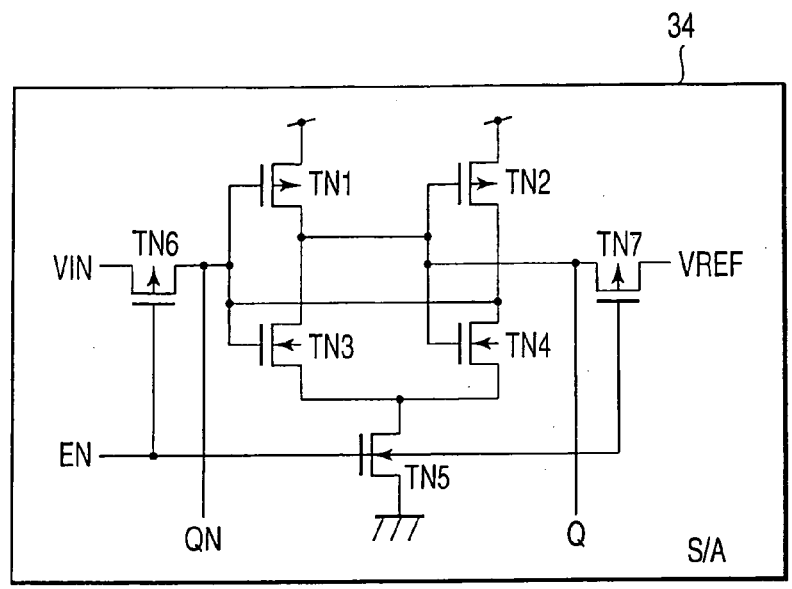
FIG. 9 is a circuit diagram showing an example of a sense amplifier shown in FIG. 2.

FIG. 9 shows an example of the sense amplifier 34. The sense amplifier 34 includes PMOS transistors TN1, TN2, TN6, TN7 and NMOS transistors TN3, TN4, TN5.

Figure 10:
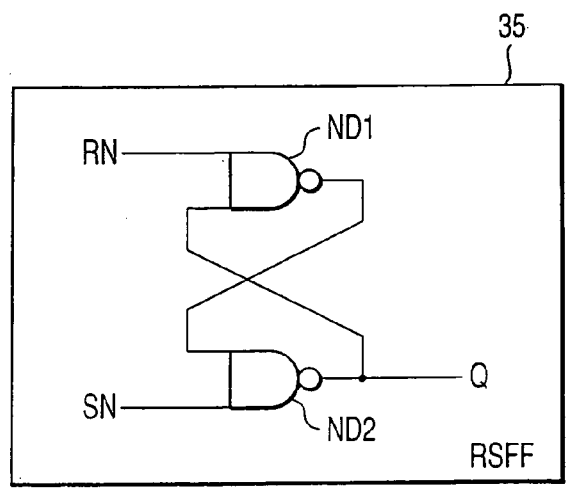
FIG. 10 is a circuit diagram showing an example of a flip-flop circuit shown in FIG. 2.

FIG. 10 shows an example of the flip-flop circuit 35. The flip-flop circuit 35 includes NAND circuits ND1, ND2.

Figure 1:
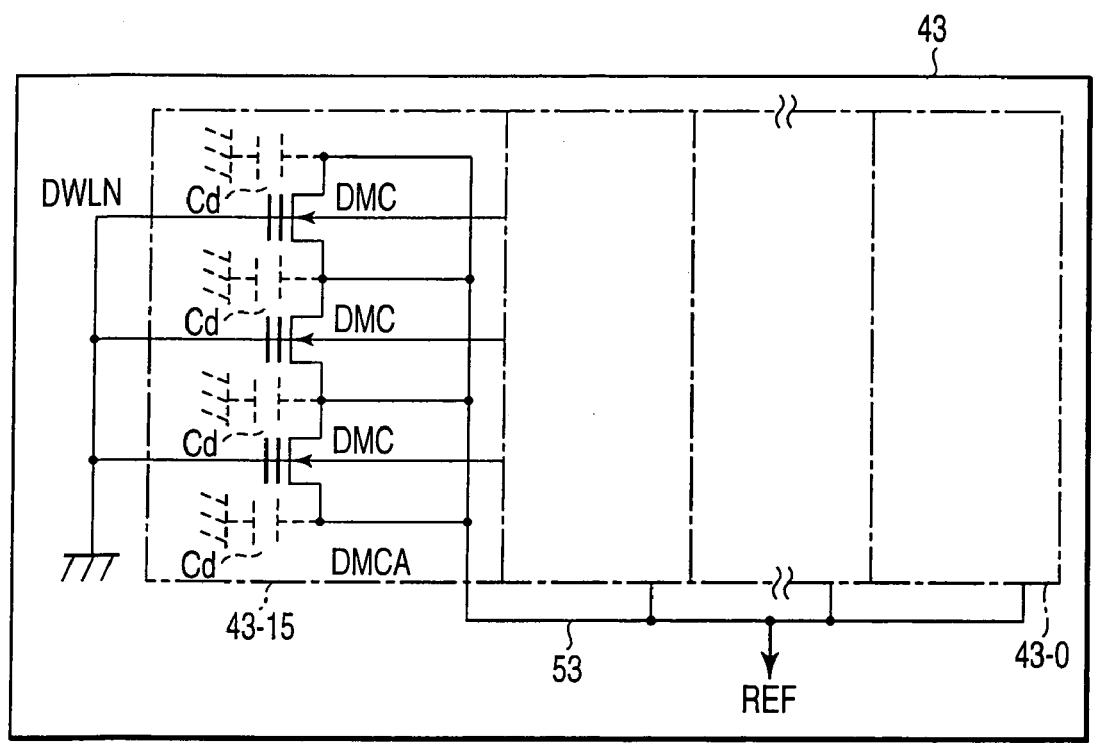
FIG. 1 is a circuit diagram showing a reference capacitor circuit according to an embodiment of this invention.

FIG. 1 shows an embodiment of the reference capacitor circuit 43. The reference capacitor circuit 43 includes dummy cell circuits 43-0, ..., 43-15 corresponding to the memory circuits 32-0, ..., 32-15. A dummy cell array DMCA is configured by the dummy cell circuits 43-0, ..., 43-15. Each of the dummy cell circuits 43-0, ..., 43-15 is configured by a plurality of dummy cells DMC. Like the memory cell, each dummy cell DMC has a stacked gate structure having a floating gate and control gate stacked with an insulating film disposed therebetween. However, the dummy cell array DMCA configuring the reference capacitor circuit 43 has a configuration different from that of the memory cell array 33. That is, in each dummy cell DMC, for example, the source/drain regions are commonly connected by use of a first-layered metal wiring 53 and reference potential is supplied to the connection node REF via the metal wiring 53.

Figure 11:
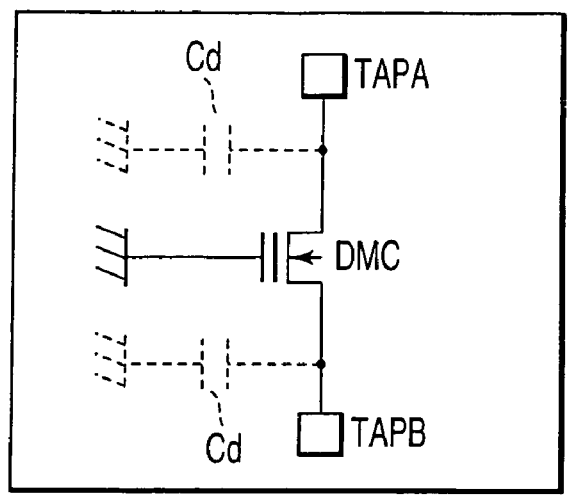
FIG. 11 is a circuit diagram showing a part of the main portion of FIG. 1.
Figure 12:
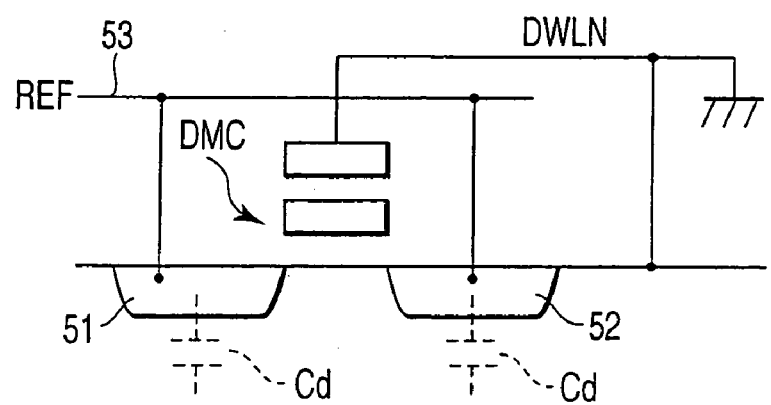
FIG. 12 is a schematic view showing the configuration of FIG. 11.
Figure 13:
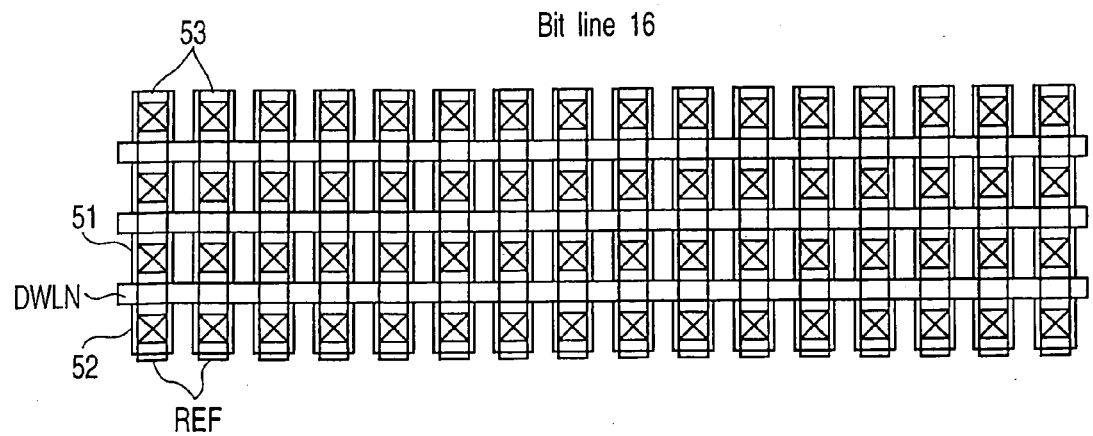
FIG. 13 is a plan view showing an example of the layout of the reference capacitor circuit shown in FIG. 1.

Specifically, as shown in FIGS. 11, 12, 13, for example, diffusion layers 51, 52 which configure the source/drain regions of each dummy cell DMC are connected together via the first-layered metal wiring 53. In other words, the dummy cell DMC has no source region and has only the drain region. Therefore, the dummy cell array DMCA requires neither a source line nor a VSS wiring which supplies the ground potential to the source line. Thus, when a wiring used to derive reference potential from the dummy cell array DMCA is formed of the first-layered metal wiring 53 like a wiring which connects together the diffusion layers 51, 52, it becomes unnecessary to carefully consider the position of the VSS wiring, which would otherwise be required in the conventional case. Therefore, the restriction on the position of formation of the wiring used to derive the reference potential can be alleviated and the degree of freedom for formation of the REF wiring can be enhanced. The control gates of the dummy cells DMC are commonly connected to a dummy word line DWLN.

As shown in FIGS. 11, 12, 13, the areas of the diffusion layers 51, 52 used as two drain regions of each dummy cell DMC are equal to each other. Each dummy cell DMC has no source region which does not function as a reference capacitor and functions as the drain region. Therefore, there is no unnecessary source region which cannot be used as the capacitor. Thus, a desired reference capacitance can be attained by dummy cells of a number smaller than that of the memory cells configuring the memory cell array 33. For example, the number of dummy cells can be set to approximately half the number of memory cells. Specifically, the layout area of the conventional reference capacitor circuit is approximately 281.250 $\mu m^2$, but the layout area of the reference capacitor circuit of this embodiment can be extremely reduced to approximately 149.76 $\mu m^2$. Thus, the layout area of the dummy cell can be reduced to approximately half the layout area of the memory cell. Therefore, if the capacity of the memory cell array is increased, the area reduction effect of the dummy cell array becomes more significant.

Figure 14:
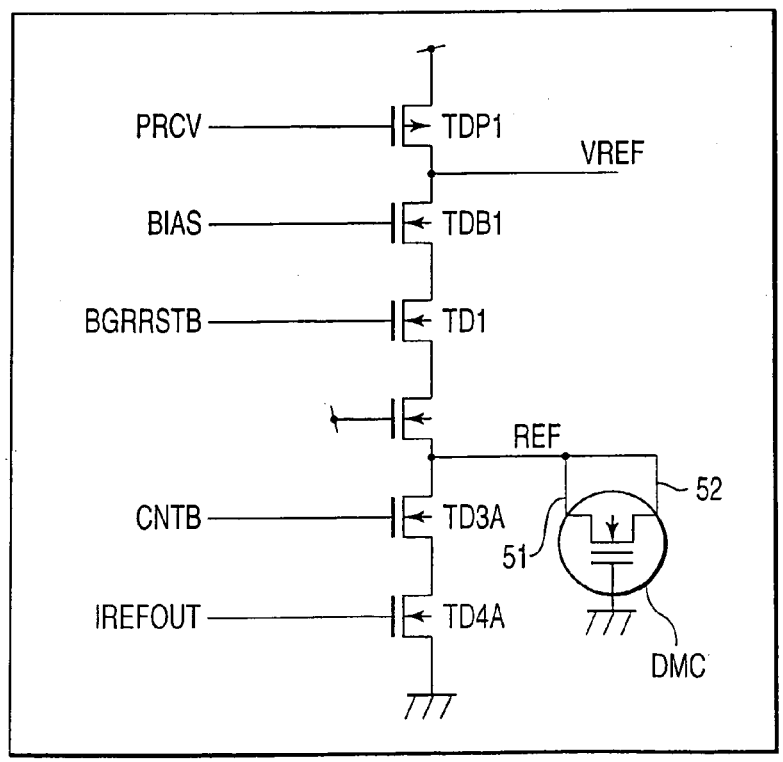
FIG. 14 is an equivalent circuit diagram of a reference capacitor circuit according to the embodiment of this invention.

As shown in FIG. 14, in the dummy cell DMC of this embodiment, the diffusion layers 51, 52 are connected together and no leak path occurs. Therefore, no leak occurs even when the gate insulating film becomes faulty. Further, since no leak path occurs, it is unnecessary to remove charges stored in the floating gate of the dummy cell DMC by use of ultraviolet rays unlike the conventional case. Thus, when metal layers are formed above the control gate of the dummy cell DMC, no problem occurs. Therefore, the restriction on the arrangement position of the reference capacitor circuit can be alleviated.

Figure 15:
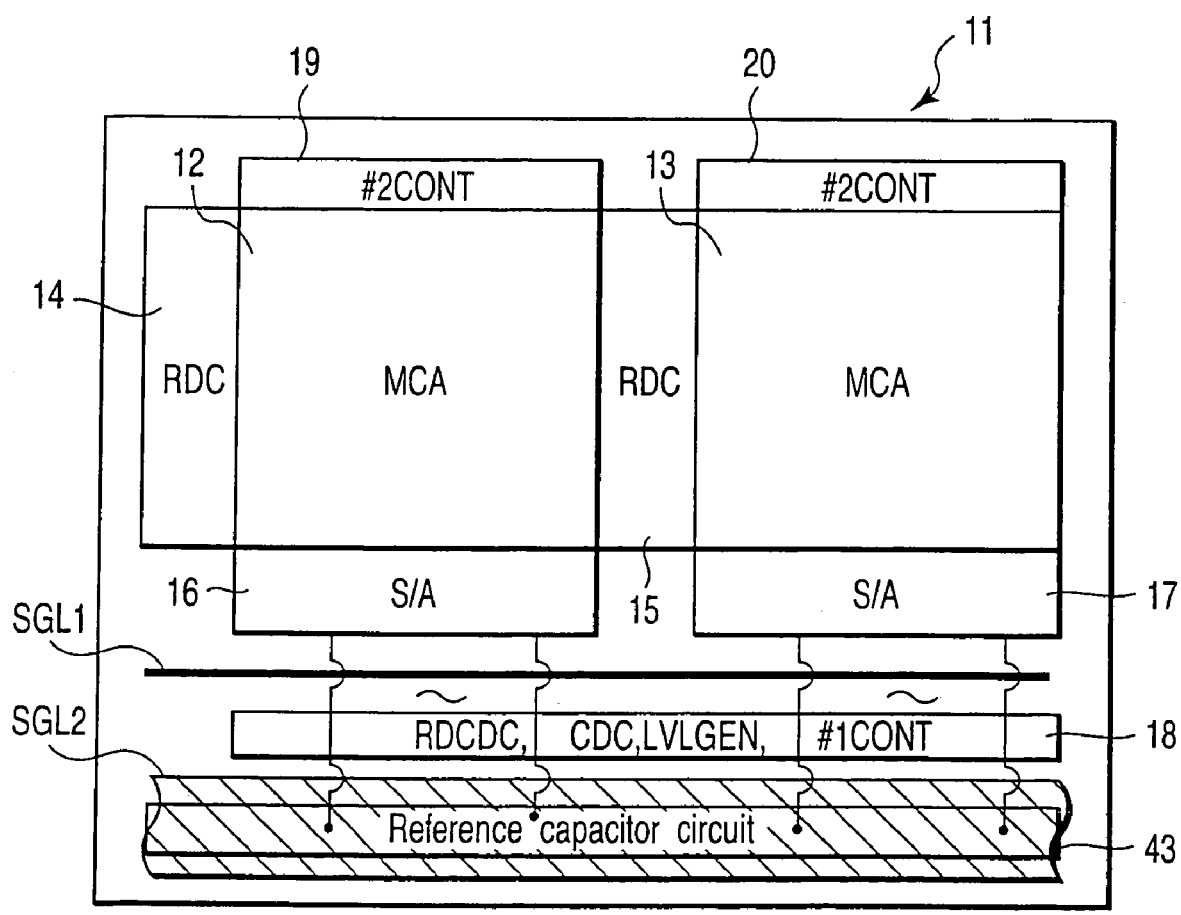
FIG. 15 is a plan view of a nonvolatile semiconductor memory device according to the embodiment of this invention.
Figure 18:
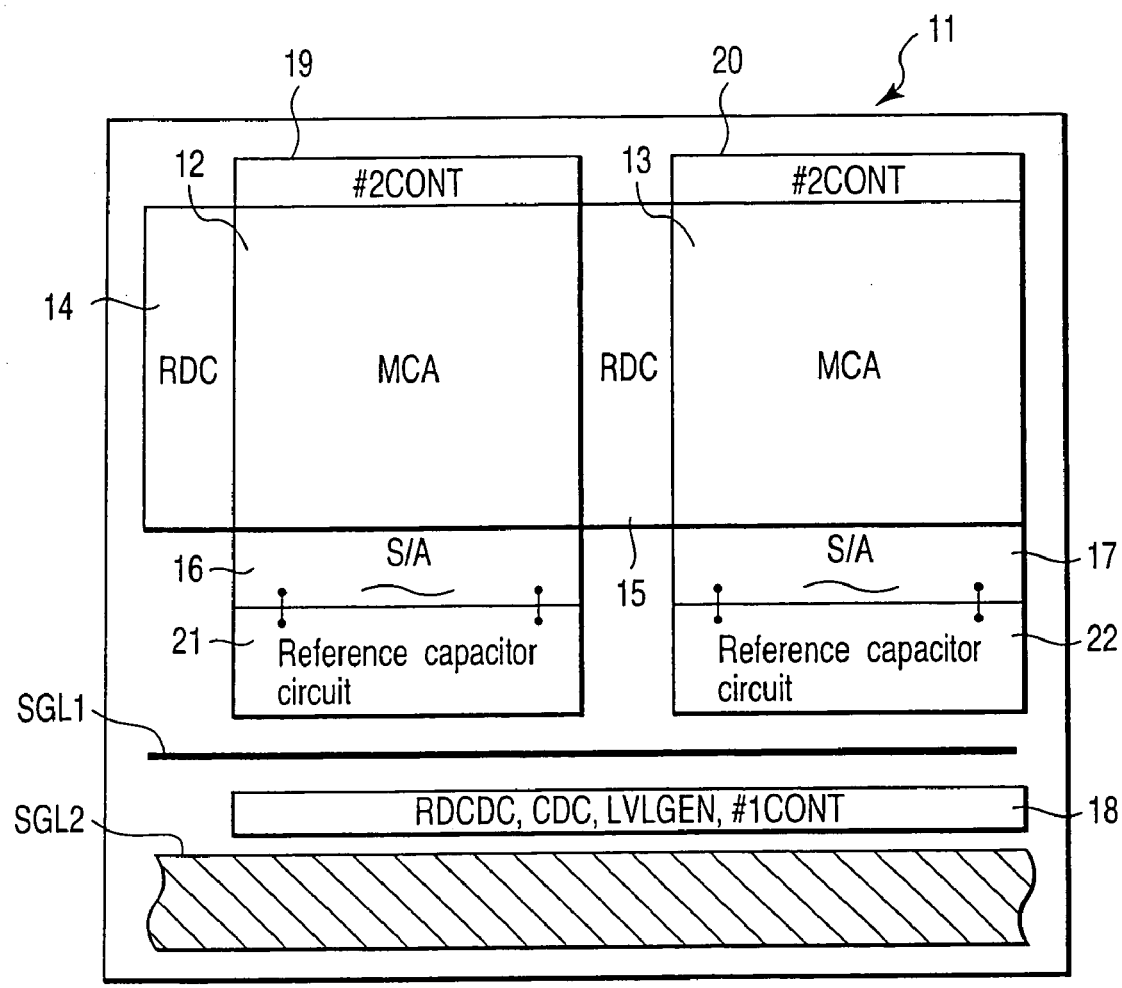
FIG. 18 is a plan view of the conventional nonvolatile semiconductor memory device.

FIG. 15 shows the floor plan of the nonvolatile semiconductor memory device according to the present embodiment. In order to compare the floor plan of FIG. 15 with the conventional floor plan shown in FIG. 18, in FIG. 15, common reference symbols are attached to the same portions as those of FIG. 18. As shown in FIG. 15, the reference capacitor circuit 43 is formed below a signal wiring region SGL2 which is separated apart from the formation regions 16, 17 of the sense amplifiers 34. Since the restriction on the arrangement position of the reference capacitor circuit 43 can be alleviated, the degree of freedom of the chip layout can be enhanced and the chip area can be reduced.

Figure 16:
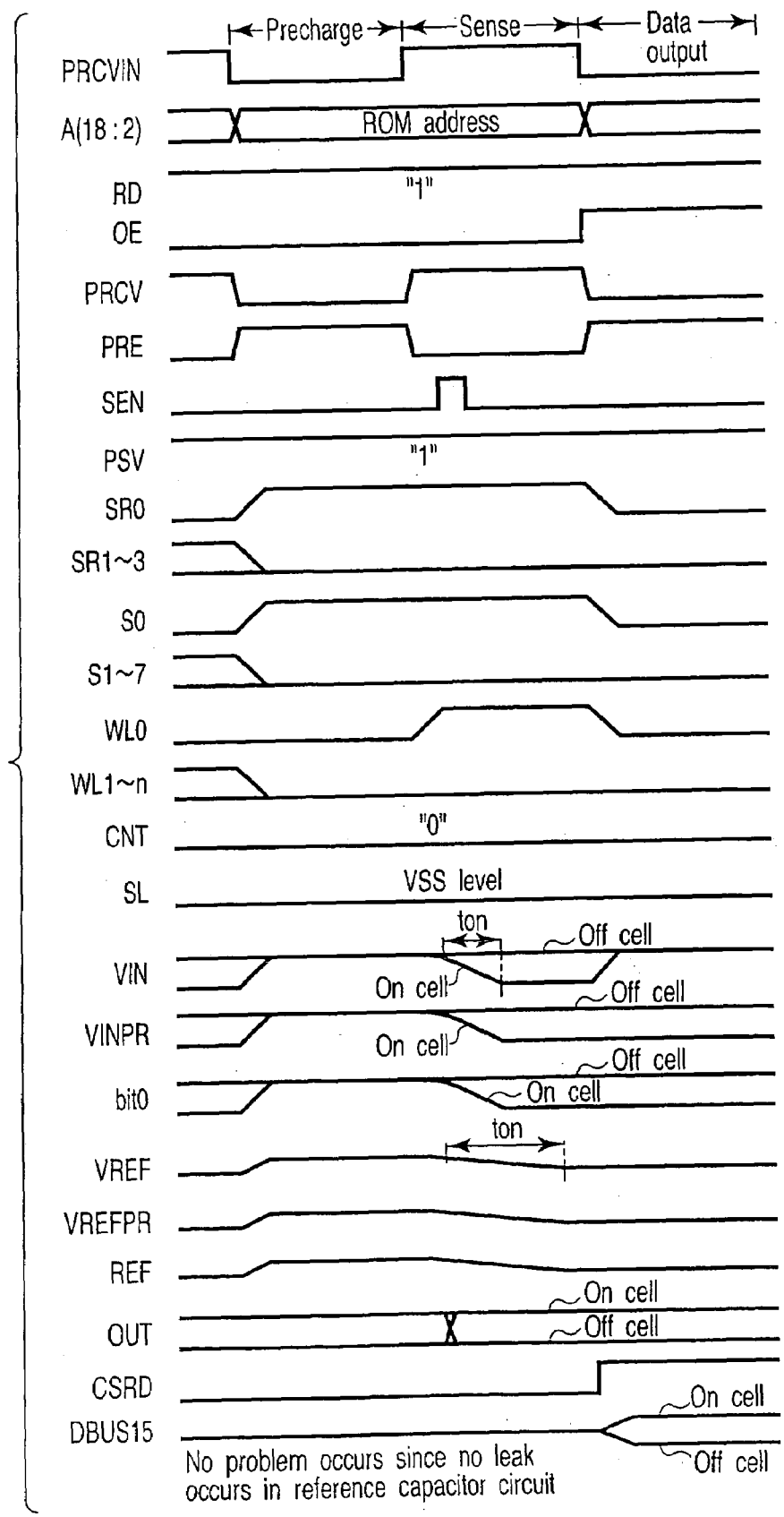
FIG. 16 is a timing chart showing the operation of the circuit shown in FIG. 2.
Figure 17:
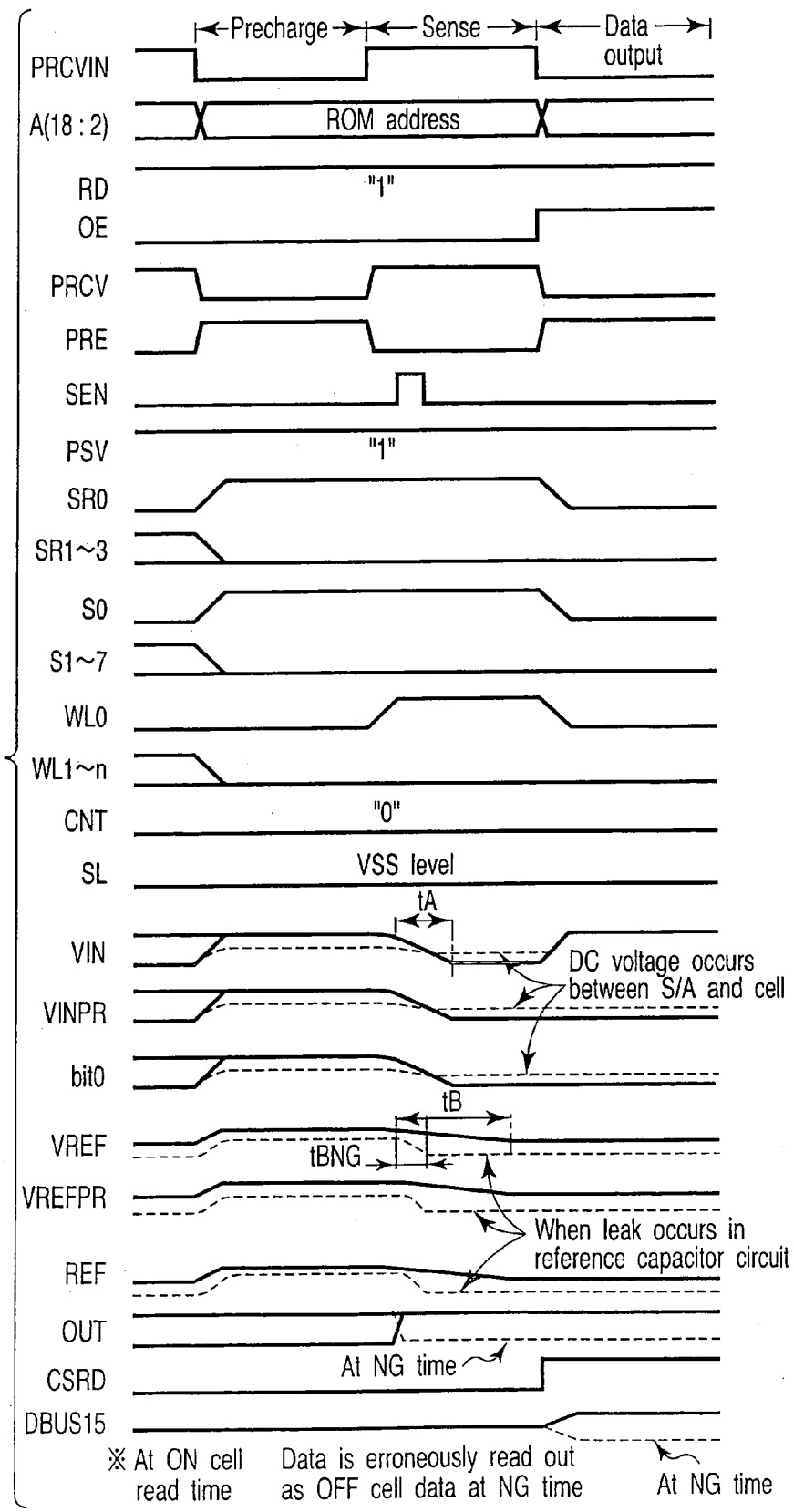
FIG. 17 is a timing chart showing the operation of the conventional circuit shown in FIG. 2.

FIG. 16 is a timing chart showing the operation of the circuit shown in FIG. 2 and FIG. 17 is a timing chart obtained when the conventional reference capacitor circuit is applied to the circuit shown in FIG. 2. In FIGS. 16 and 17, common reference symbols are attached to the same portions as those of FIG. 2. As shown in FIG. 17, if the conventional reference capacitor circuit is used and a dummy cell becomes faulty, a lowering in the potential occurs due to the leak in the precharge period, sense period and data output period. Therefore, data may be erroneously read out in the sense period and data output period.

On the other hand, in the dummy cell DMC of this embodiment, no leak path occurs. Therefore, as shown in FIG. 16, a lowering in the potential due to the leak does not occur in the precharge period, sense period and data output period. As a result, data can be correctly read out in the sense period and data output period. Thus, the stable operation can be performed as the operation of the nonvolatile semiconductor memory device. Further, since no leak occurs, an increase in power consumption can be suppressed in the precharge period.

According to the present embodiment, the first and second diffusion layers 51, 52 of the dummy cell DMC which configure the reference capacitor circuit are connected together by use of the wiring 53 and the reference potential is derived via the wiring 53. Therefore, the dummy cell DMC has no leak path. Thus, occurrence of an increase in power consumption at the precharge time can be suppressed and erroneous data readout at the sense time and output time can be prevented.

Further, the first and second diffusion layers 51, 52 of the dummy cell DMC have the same area and the same diffusion capacitance. In addition, the dummy cell DMC has no source region which does not function as the capacitor and has the first and second diffusion layers 51, 52 as a drain region and uses the same as a capacitor. Therefore, the number of dummy cells can be set to approximately half the number of memory cells. Further, since the dummy does not require a source line, the occupied area of the dummy cell can be greatly reduced.

Since the dummy cell does not require a source line and a VSS wiring which supplies the ground potential to the source line, the VSS wiring does not impose restriction on the arrangement of the connection node REF. Therefore, the degree of freedom of the wiring connected to the connection node REF can be enhanced.

Further, the dummy cell does not require a source line and a VSS wiring which supplies the ground potential to the source line. Therefore, unlike the conventional case, it is unnecessary to arrange the reference capacitor circuit 43 adjacent to the sense amplifier and it is possible to arrange the same in a desired space region. Since it is unnecessary to apply ultraviolet rays to the dummy cell, the dummy cell can be arranged below the signal wiring region SGL2. As a result, restriction on the layout of the reference capacitor circuit 43 can be greatly alleviated and the layout area of a system in which a nonvolatile semiconductor memory device is also provided can be reduced.

No leak current occurs in the dummy cell even if the gate insulating film becomes faulty. Therefore, a nonvolatile semiconductor memory device can be configured in which a stable reference potential can be supplied to the sense amplifier 34 and a potential fluctuation and AC fluctuation of the sense amplifier 34 can be suppressed to perform the stable operation.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
   a dummy cell having first and second diffusion layers, floating gate and control gate; and
   a wiring which commonly connects the first and second diffusion layers of the dummy cell,
   wherein areas of the first and second diffusion layers of the dummy cell are the same and the control gate thereof is grounded.

2. The device according to claim 1, further comprising a plurality of metal wirings arranged above the dummy cell.

3. The device according to claim 1, further comprising a memory cell array having a plurality of memory cells arranged in a matrix form and each having first and second diffusion layers, floating gate and control gate.

4. The device according to claim 3, further comprising a dummy cell array having a plurality of dummy cells having the same configuration as the dummy cell.

5. The device according to claim 4, wherein the number of dummy cells configuring the dummy cell array is approximately equal to half that of memory cells configuring the memory cell array.

6. A nonvolatile semiconductor memory device comprising:
   a memory cell having a floating gate, control gate, and drain and source, the drain of the memory cell being connected to a bit line, the source thereof being connected to a source line and the control gate thereof being connected to a word line;
   a sense amplifier having a first input terminal to which a signal read out from the memory cell to the bit line is supplied and a second input terminal to which a reference signal is supplied;
   a precharge circuit which precharges the first and second input terminals of the sense amplifier, and
   a dummy cell having a floating gate, control gate, and first and second diffusion layers, the first and second diffusion layers of the dummy cell being connected together and the reference signal being output from a connection node of the first and second diffusion layers.

7. The device according to claim 6, wherein areas of the first and second diffusion layers of the dummy cell are the same and the control gate thereof is grounded.

8. The device according to claim 6, further comprising a plurality of metal wirings arranged above the dummy cell.

9. A nonvolatile semiconductor memory device comprising:
   a memory cell array having a plurality of memory cells arranged at intersections between a plurality of bit lines and a plurality of word lines;
   a plurality of sense amplifiers each having a first input terminal to which a signal read out from a selected one of the memory cells of the memory cell array is supplied and a second input terminal to which a reference signal is supplied;
   a dummy cell array having a plurality of dummy cells each having a floating gate, control gate, and first and second diffusion layers and arranged in a matrix form, the first and second diffusion layers of each dummy cell of the dummy cell array being commonly connected via a wiring and the dummy cell array outputting the reference signal corresponding to a capacitance of the bit line,
   wherein areas of the first and second diffusion layers of the dummy cell are the same and the control gate thereof is grounded.

10. The device according to claim 9, further comprising a plurality of metal wirings arranged above the dummy cell.

11. The device according to claim 9, wherein the number of dummy cells configuring the dummy cell array is smaller than the number of memory cells configuring the memory cell array.

12. The device according to claim 10, wherein the number of dummy cells configuring the dummy cell array is approximately equal to half the number of memory cells configuring the memory cell array.

13. A nonvolatile semiconductor memory device comprising:
   a memory cell array having a plurality of memory cells arranged in rows and columns, each of the memory cells having a floating gate, control gate, drain and source;
   a sense amplifier region arranged adjacent to the memory cell array, the sense amplifier region having a plurality of sense amplifiers;
   a column selection region arranged adjacent to the sense amplifier region, the column selection region having a column selection circuit which selects the column of the memory cell array; and
   a dummy cell array arranged in opposition to the sense amplifier region with the column selection region disposed therebetween, the dummy cell array having a plurality of dummy cells each having a floating gate, control gate, and first and second diffusion layers and the first and second diffusion layers of each dummy cell being connected together,
   wherein areas of the first and second diffusion layers of the each dummy cell are the same and the control gate thereof is grounded.

14. The device according to claim 13, further comprising a wiring region arranged above the dummy cell array. the number of dummy cells configuring the dummy cell array is smaller than the number of memory cells configuring the memory cell array.

15. The device according to claim 13, wherein the number of dummy cells configuring the dummy cell array is smaller than the number of memory cells configuring the memory cell array.

16. The device according to claim 15, wherein the number of dummy cells configuring the dummy cell array is approximately equal to half the number of memory cells configuring the memory cell array.

17. The device according to claim 13, wherein each of dummy cells outputs the reference signal from a connection node of the first and second diffusion layers.

* * * * *